United States Patent [19]
Hahn et al.

[11] Patent Number: 5,281,864
[45] Date of Patent: Jan. 25, 1994

[54] IMPLEMENTATION OF THE IEEE 1149.1 BOUNDARY-SCAN ARCHITECTURE

[75] Inventors: Reinhard Hahn, Haag; Norbert Hummer, Forchheim, both of Fed. Rep. of Germany

[73] Assignee: Motorola GmbH, Munich, Fed. Rep. of Germany

[21] Appl. No.: 866,602

[22] Filed: Apr. 10, 1992

[30] Foreign Application Priority Data

May 23, 1991 [GB] United Kingdom ............... 9111179

[51] Int. Cl.$^5$ .................... H03K 3/289; H03K 3/12
[52] U.S. Cl. ..................... 307/272.2; 307/291; 307/465; 328/206
[58] Field of Search ........... 307/272.2, 289, 291, 307/247.1, 269, 465, 465.1; 328/206

[56] References Cited

U.S. PATENT DOCUMENTS

| | | | |
|---|---|---|---|
| 4,628,216 | 12/1986 | Mazumder | 307/291 |
| 4,926,451 | 5/1990 | Yoshihara et al. | 307/269 |
| 4,970,410 | 11/1990 | Matsushita et al. | 307/465 |
| 5,083,049 | 1/1992 | Kagey | 307/272.2 |
| 5,124,573 | 6/1992 | Wong | 307/289 |
| 5,128,970 | 7/1992 | Murphy | 307/269 |
| 5,173,626 | 12/1992 | Kudou et al. | 307/272.2 |

*Primary Examiner*—Stuart S. Levy
*Assistant Examiner*—Toan Tran
*Attorney, Agent, or Firm*—Michael A. Waters; Joe E. Barbee

[57] ABSTRACT

A circuit for a boundary-scan cell for the JTAG Architecture, the circuit including a capture section(50) coupled in cascade to an update section(52), and each section comprising a flip-flop (34,36) having a clock input for receiving a common clock signal (TCK, TCKB) and a multiplexer having a first input for receiving an input data signal, a second input coupled to an output of the flip-flop, an output coupled to a flip-flop input, and a select input for receiving a control signal for selectively coupling the first or second input to the multiplexer output.

11 Claims, 8 Drawing Sheets

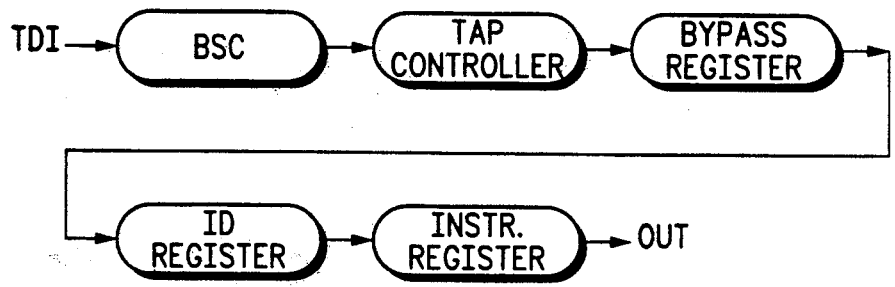
FIG. 7
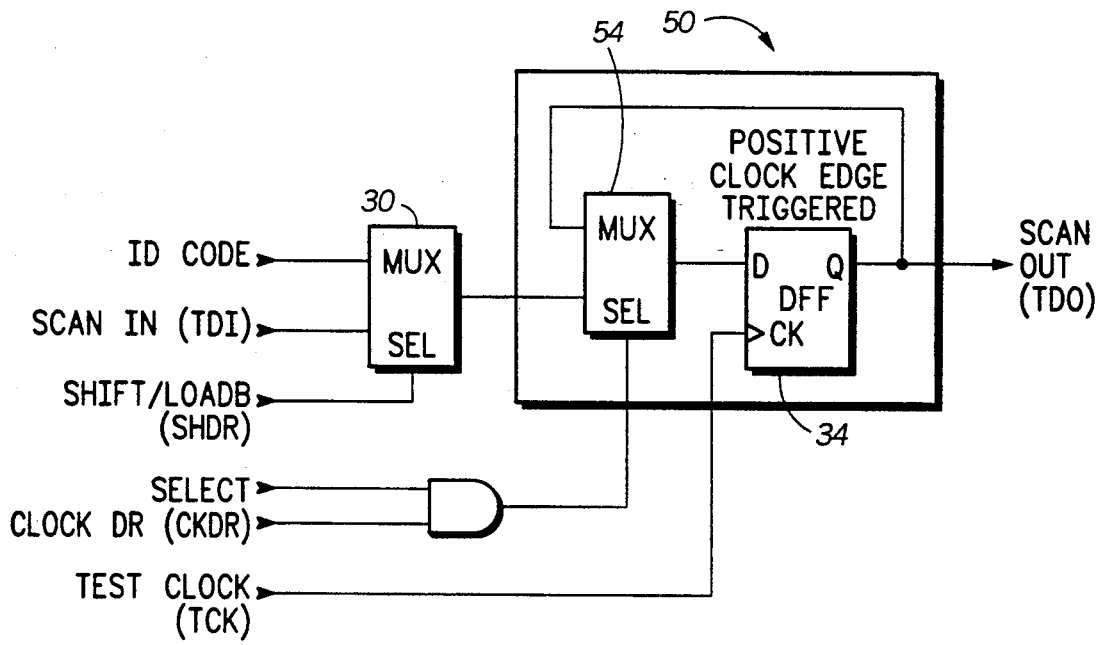
FIG. 8

IMPLEMENTATION OF THE IEEE 1149.1 BOUNDARY-SCAN ARCHITECTURE

FIELD OF THE INVENTION

This invention relates to a circuit for implementing the IEEE 1149.1 Standard Test Access Port and Boundary-Scan Architecture (hereinafter referred to as the JTAG Architecture).

BACKGROUND ART

As shown in FIG. 1, the JTAG (Joint Test Action Group) Architecture involves providing an integrated circuit 2 with a boundary-scan cell 4 coupled between each terminal pin 6 and on-chip system logic 8, whereby signals at the boundary of the IC can be controlled and observed using scan testing principles. The cells 4 effectively provide individual stages of a shift register (as shown in FIG. 3), and other integrated circuits connected to the same board (not shown) are likewise coupled to form a very long shift register composed of the individual boundary cells. A boundary cell normally provides a sample capability of input data from the terminal pin, a sample capability of output data from the system logic, a set capability of the output data, and a transparent mode.

The JTAG Architecture is shown in FIG. 2 for implementation on the chip 2 of FIG. 1. The various pads indicated comprise the terminal pins 4 of FIG. 1 and receive the signals indicated TCK, TMS, TRSTB, TDI, and providing an output signal TDO. TAP controller logic 20 is provided which provides the gated clock signals and control signals indicated in FIG. 2 to an instruction register 22, whence instructions in the register are decoded by an instruction D code unit 24 to provide appropriate control signals to a group of registers 26 known as test data registers and comprising a boundary-scan register, a device identification register, a design specific test data register and a bypass register. The output of these registers are coupled via multiplexers 28 and a D type flip-flop 29 to provide output signal TDO.

The JTAG Architecture provides standardized approaches to: (1) testing the interconnection between IC's once they have been assembled onto a printed circuit board, (2) testing the IC itself, and (3) observing or modifying circuit operation during a component's normal operation.

A known implementation of a boundary-scan cell with sample, preload and set capability is shown in FIG. 3 as comprising a data in port DI coupled to a first input of a multiplexer 30 and a first input of a multiplexer 32. The output from multiplexer 32 provides a signal out port DO. A second input of multiplexer 30 is coupled to receive a scan in signal TDI. Multiplexer 30 has a select input coupled to receive a shift/load signal SHDR. The output of multiplexer 30 is coupled to the D input of D-type capture flip-flop 24 whose output is coupled to the D input of an D type update flip-flop 36, whose output is coupled to a second input of multiplexer 32. The output of flip-flop 34 also provides a scan out signal TDO. Multiplexer 32 has a select input coupled to receive a mode signal. Flip-flops 34 and 36 are coupled to receive gated clock signals CKDR, UDDR respectively. The control signals and gated clock signals are generated by tap controller 20 of FIG. 2.

The implementation shown in FIG. 3 is asynchronous in the sense that the clock signals CKDR, UDDR, are clock signals produced by gating an input clock signal TCK within tap controller 20 of FIG. 2. Such gated clock signals produce problems of racing in a complex design and in practice it will not be possible to check out all race related hazards with a logic simulator. Tracing the source of such hazards (glitches, spikes) and correcting them can be extremely time consuming and expensive.

Further such problems arising from asynchronism imply that CAD tools, in particular ATPG (automatic test pattern generation) software diagnostic tools, cannot be efficiently used, since they require a synchronous environment.

SUMMARY OF THE INVENTION

The present invention provides a circuit for a boundary-scan cell for the JTAG Architecture which overcomes or at least reduces the above noted problems.

The present invention provides in a first aspect a circuit for the JTAG Architecture, the circuit including a flip-flop having a clock input for receiving a common clock signal (TCK, TCKB) and a multiplexer having a first input for receiving an input data signal, a second input coupled to an output of the flip-flop, an output coupled to a flip-flop input, and a select input for receiving a control signal (CKDR, UDDR) for selectively coupling the first or second inputs to the multiplexer output.

In a more specific aspect, the present invention provides a circuit for a boundary-scan cell for the JTAG Architecture, the circuit including a capture section coupled in cascade to an update section, and each section comprising a flip-flop having a clock input for receiving a common clock signal (TCK, TCKB) and a multiplexer having a first input for receiving an input data signal, a second input coupled to an output of the flip-flop, an output coupled to a flip-flop input, and a select input for receiving a control signal for selectively coupling the first or second input to the multiplexer output.

Thus in accordance with the invention a synchronous implementation of the JTAG Architecture is provided, since the common clock signal is provided directly at the input to an IC and is employed to clock all the flip-flops within the boundary-scan cells of the boundary-scan register as well as the various cells of the various other registers within the architecture. Nevertheless such an arrangement is compatible with the IEEE requirements, since said control signals are desirably the required gated clock signals such as CKDR, UDDR, are employed to gate the multiplexer inputs. Thus for data to be entered into a flip-flop, it is necessary both for the common clock signal to clock the flip-flop and for the gated clock signal to select the multiplexer input providing a data in signal. If the gated clock signal is not operative to select the data in signal, then the existing data is merely circulated from the flip-flop via the multiplexer back to the input of the flip-flop in response to the common clock signal.

Such an arrangement lends itself to implementation in ASIC (application specific integrated circuit) environment, since the basic unit of flip-flop and multiplexer may be implemented as a standard cell in a cell library.

The flip-flop in the circuit of the present invention may be a D-type flip-flop; alternatively and as preferred the flip-flop may comprise a scan flip-flop having a further SCAN IN input and a further control input for selecting a scan mode of operation in which the SCAN IN input is selected to provide data to the flip-flop. In the scan mode of operation the various capture sections of individual boundary-scan cells are connected to form a scan chain (the update sections form a separate scan chain) to permit scanning of the boundary-scan cells with automatic test pattern generation tools.

BRIEF DESCRIPTION OF THE DRAWINGS

Preferred embodiments of the invention will now be described with reference to the accompanying drawings wherein:

FIG. 7 is a schematic showing the formations of scan chains using the cells of FIG. 6;

FIG. 8 is a circuit diagram of a device identification register cell in accordance with the first embodiment of the invention.

DESCRIPTION OF THE PREFERRED EMBODIMENT

Figure 1:
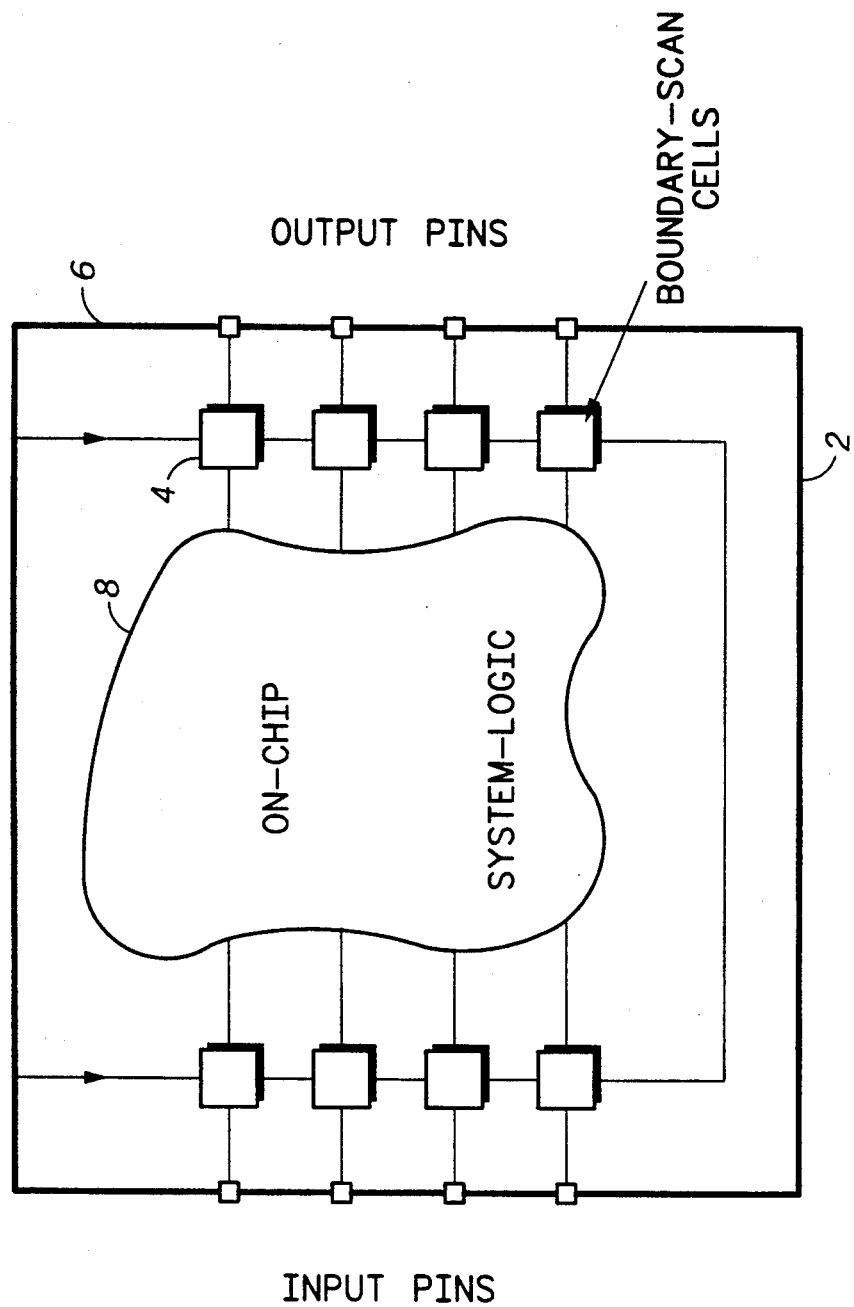
FIG. 1 is a schematic view of the boundary-scan system.
Figure 2:
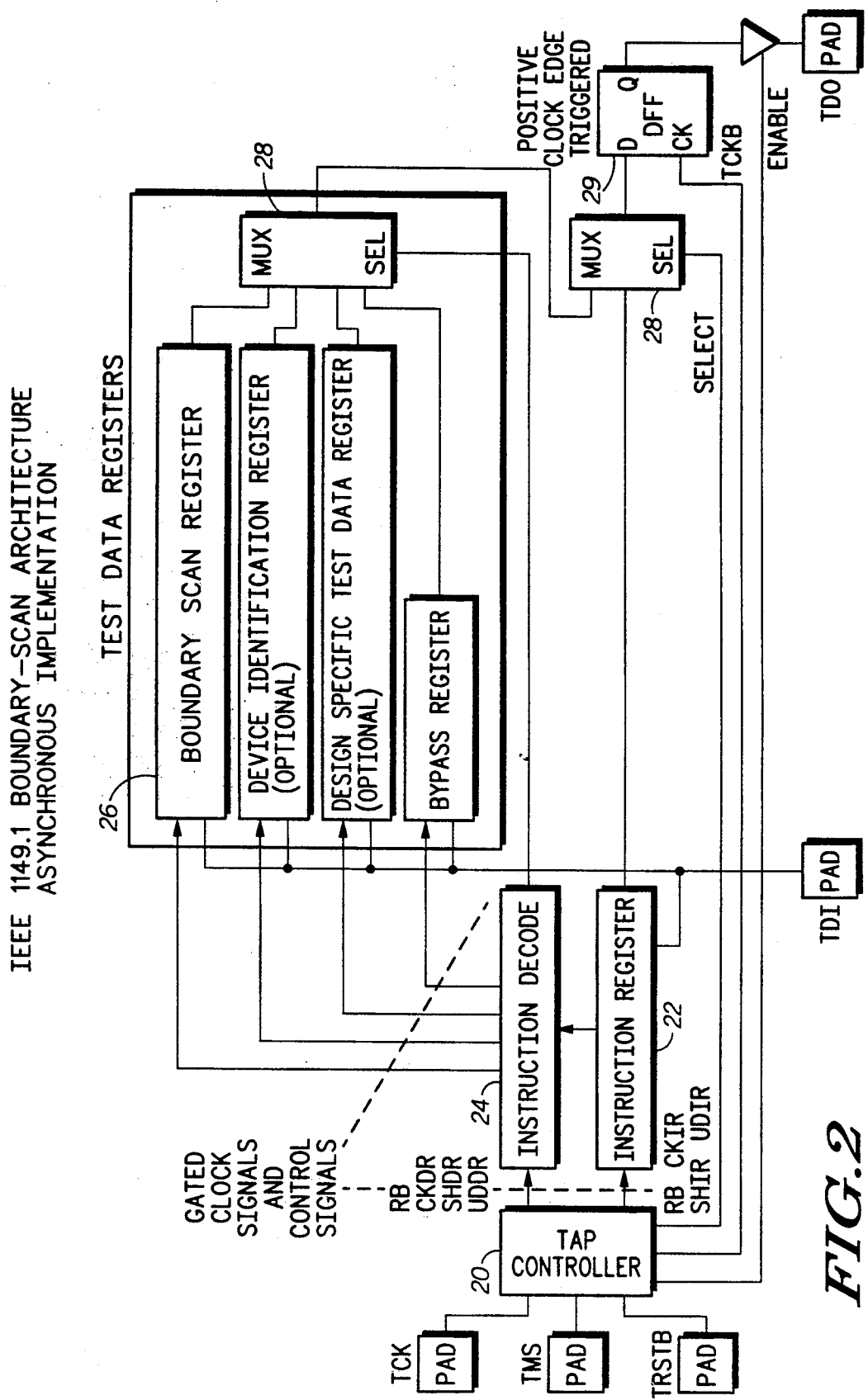
FIG. 2 is a block diagram of the JTAG Architecture.
Figure 4:
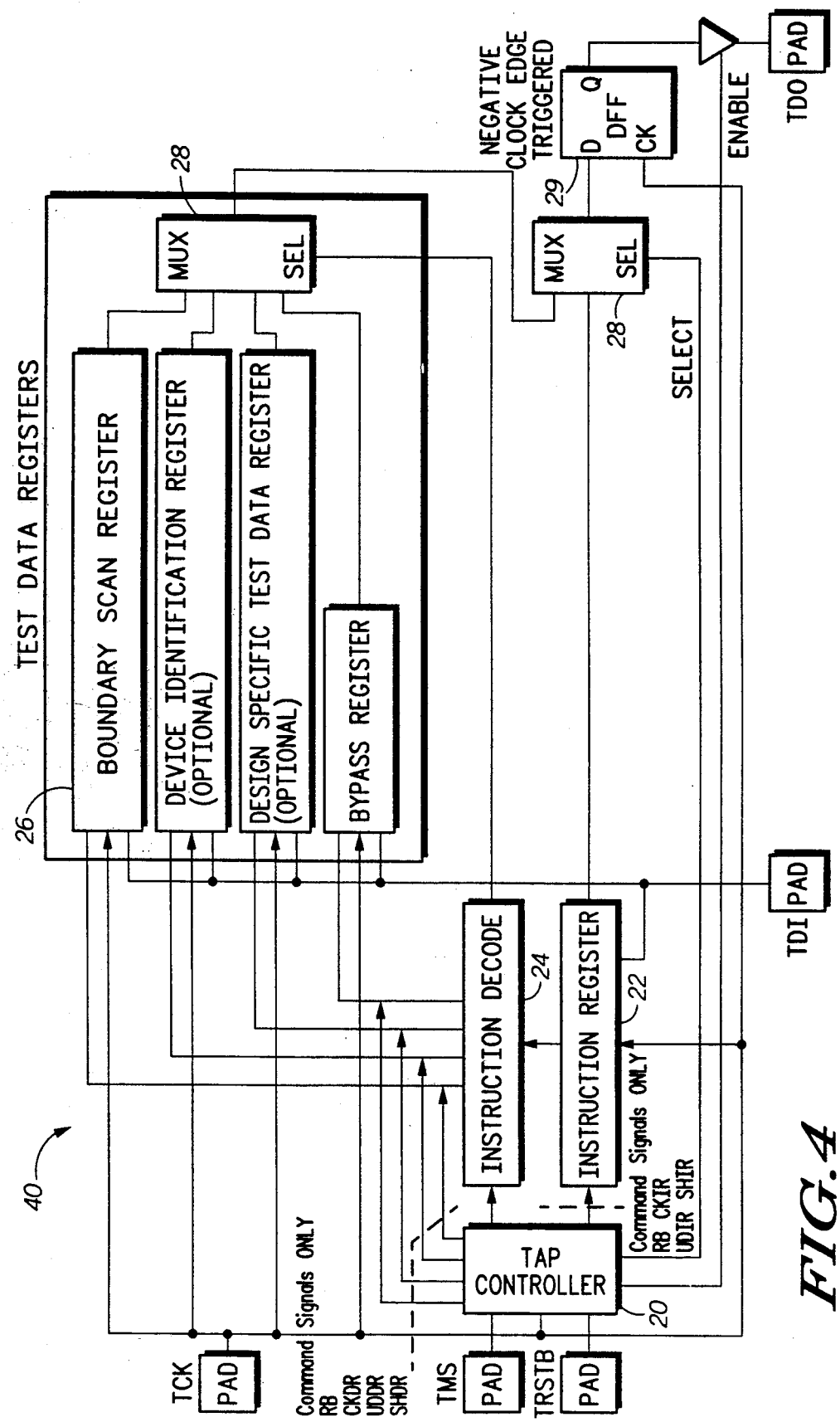
FIG. 4 is a block diagram of the JTAG Architecture incorporating a common clock signal arrangement for providing synchrony.

Referring now to FIG. 4 of the drawings, this is generally similar to the boundary-scan architecture shown in FIG. 2, and similar parts will be denoted by the same reference numeral. The architecture differs principally in providing direct connections 40 from the input pad receiving the common clock signal TCK to the various registers and other parts of the architecture. The signals generated by TAP controller 20, remain the same, but are employed solely as control signals.

Figure 3:
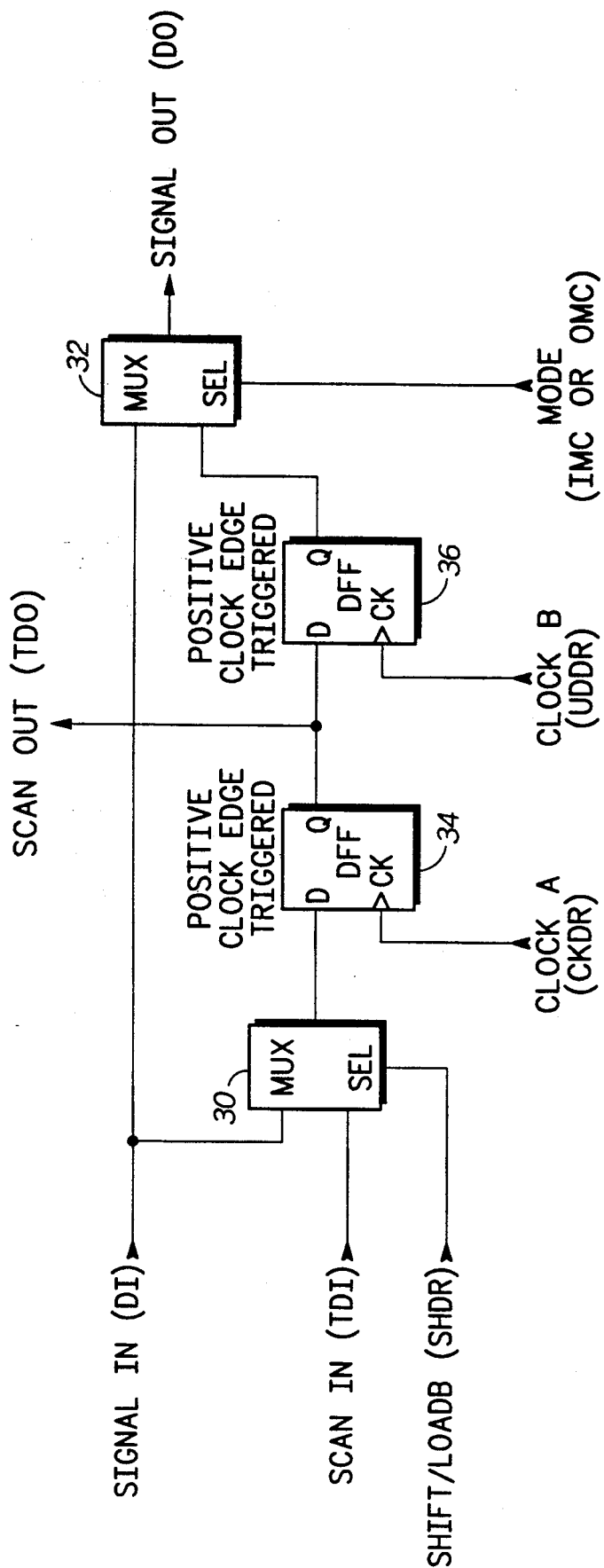
FIG. 3 is a circuit diagram of a known implementation of a boundary-scan cell.
Figure 5:
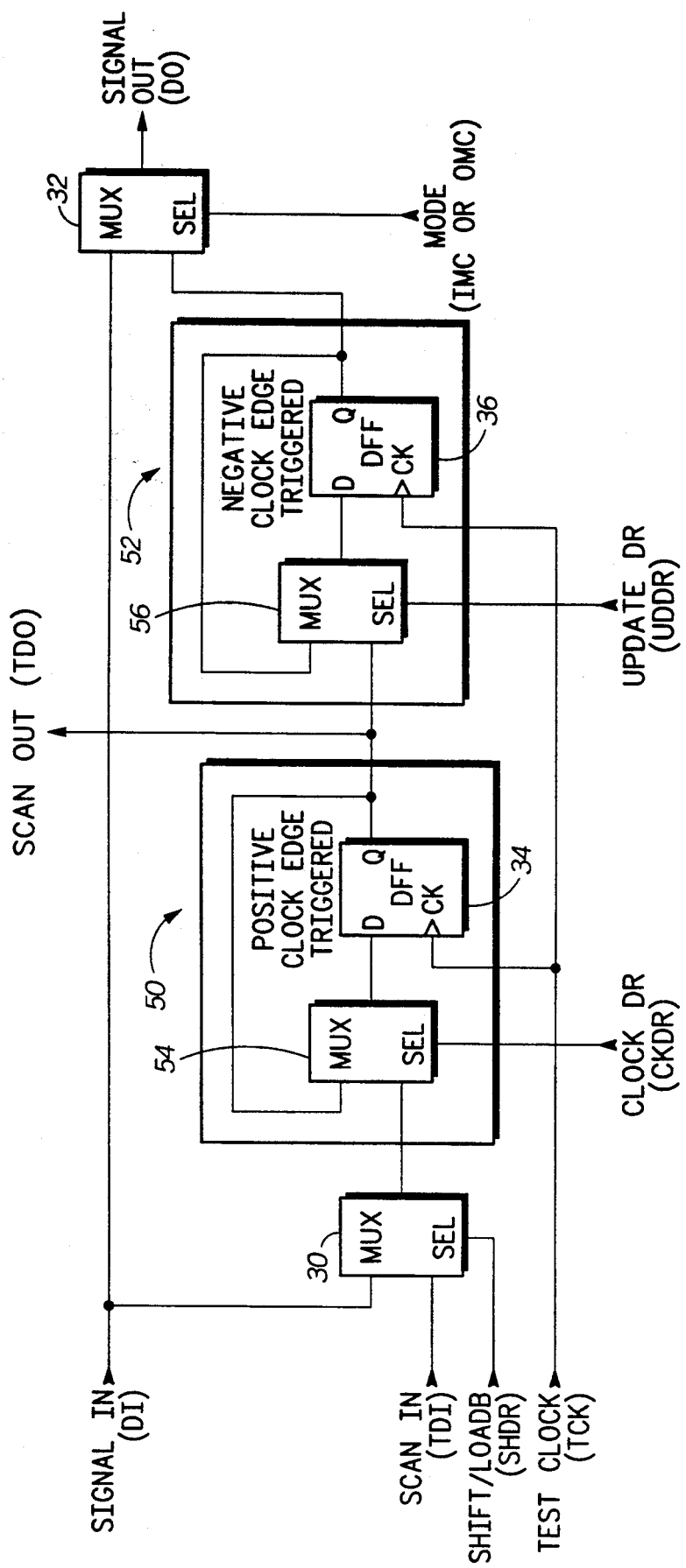
FIG. 5 is a circuit diagram of a boundary-scan cell in accordance with a first embodiment of the invention.

Referring now to FIG. 5 which shows a boundary-scan cell in accordance with a first embodiment of the invention, similar parts to those shown in FIG. 3 are given the same reference numeral. The cell is divided into a capture section 50 and an updated section 52, capture section 50 comprising a multiplexer 52 and flip-flop 34, and update section 52 comprising a multiplexer 56 and flip-flop 36. A common test clock signal TCK is applied to the clock inputs of flip-flop 34, 36. The output of the capture flip-flop 34 is fed back to a first input of multiplexer 54 and the output of the multiplexer 30 is coupled to the second input of multiplexer 54. The output of multiplexer 54 is coupled to the D input of flip-flop 34, and the inputs of multiplexer 50 are selected by means of the gated clock signal CKDR.

Similarly, in update section 52 the output of multiplexer 56 is coupled to the D input of flip-flop 36, the output of flip-flop 36 being fed back to a first input of multiplexer 56, and a second input of multiplexer 56 being coupled to receive the output of flip-flop 34. The inputs of multiplexer 56 are selected by control or gated clock signal UDDR.

In operation, flip-flop 34 is triggered on the positive edge of clock signal TCK and flip-flop 36 is triggered on the negative edge of flip-flop TCK. If there is no requirement to capture data in capture section 50, then data is merely circulated from the output of flip-flop 34 back via multiplexer 54 to the input of flip-flop 34. If however data clock signal CKDR is operative to select the data in signal, then new data will be captured in the flip-flop in response to clocking by the common clock signal. Similarly, for update section 56, data is circulated within the update section until such time as the gated clock signal UDDR operates to select the input of multiplexer 56 which is coupled to the output of capture section 52.

Thus is may be seen, referring to FIGS. 4 and 5 that all sequential elements (D flip-flops) are driven by the single main clock TCK. No logic is placed in the sequential elements clock path. The use of D flip-flops as storage elements means that all internal events are triggered by, and sampled on the active clock edge. All transitions that were triggered by the clock edge TCK must have settled to a stable state by the time the next clock edge arrive. Race conditions which may occur in a logic path are not of any concern as long as the triggered transitions have settled to the stable state.

Figure 6:
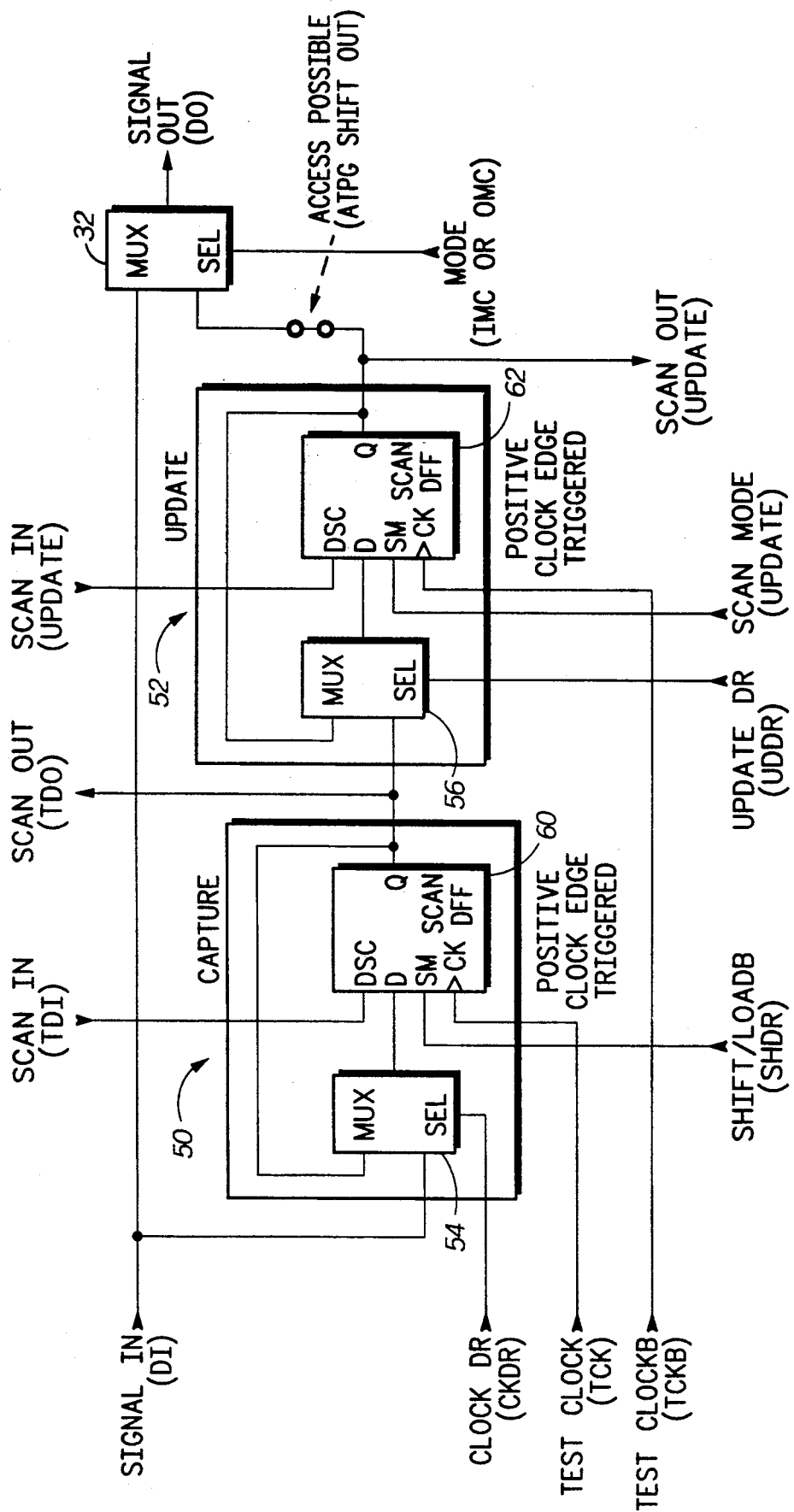
FIG. 6 is a circuit diagram of a boundary-scan cell in accordance with a second embodiment of the invention.

Referring now to FIG. 6 which shows a second and a preferred embodiment of a boundary-scan cell, similar parts to those shown in FIG. 5 are indicated by the same reference numeral. In FIG. 6, a scan D type flip-flop 60 is provided in capture section 50, and a scan D type flip-flop 62 is provided in update section 50. Multiplexer 30 is emitted. Scan flip-flop 60 has two data inputs, DSC for receiving a scan in TDI signal, and D for receiving a data in signal DI. These inputs are selected by a select signal SHDR. Similarly, scan flip-flop 62 has first and second data inputs which are selected by UPDATE select signal, input DSC receiving a scan in signal UPDATE and input D receiving the output of capture section 50.

In addition the test clock signal is provided as two separate signals TCK which is operative to clock capture section 54, and inverse signal TCKB which is operative to clock on its leading edge update section 56.

The operation of the embodiment in FIG. 6 is similar to that of FIG. 5 but in addition, the scan flip-flops permit the formation of scan chains which are of use in automatic test pattern generation. FIG. 7 shows in schematic form two separate scan chains.

To provide the highest level of automation in the design flow it is absolutely necessary to automatically generate test vectors for the complete system, the system logic and the boundary-scan. The usage of both edges of test clock violates a design rule for all known ATPG tools. These tools are only able to handle one clock edge. To use ATPG tools the following main design rules must be considered.

All flip-flops must be scan flip-flops and be elements of a scan chain.

All flip-flops in a scan chain must be clocked on the same clock edge.

Therefore a boundary-scan system must be reconfigured during ATPG mode to meet these two design rules, as indicated in FIG. 7.

All positive edge triggered scan flip-flops are connected during ATPG mode to a complete scan chain clocked by TCK and all negative edge triggered scan flip-flops are connected to a separate scan chain clocked by TCKB.

The capture part of the boundary-scan register cells build up a whole scan chain from TDI to TDO, including the capture scan flip-flop of the instruction register and positive edge triggered flip-flops in the tap-controller. These existing scan chains are used to create the positive edge triggered scan path.

The positive edge triggered scan path starts at the TDI input and ends at a separate scan path out pin, the negative edge triggered scan path starts at one input pin and ends at the TDO output. During ATPG mode there are two possibilities to connect and run these two scan chains.

A whole scan chain is built up from TDI input to TDO output by connecting both scan chains together. This scan path must be clocked on the same edge during ATPG mode. To generate a common clock a EXOR gate can be used. This EXOR gate is controlled by the ATPG enable signal and controls the TCKB. During functional mode the EXOR generates TCKB out of TCK, during ATPG mode TCKB is synchronous to TCK.

By this kind of connection of the scan chains and clock generation a clock skew problem can appear at the interface between the positive edge triggered scan path and the "negative" edge triggered scan path.

This clock skew problem can be solved by using two separate scan chains with TCK and TCKB clock signals. A multiplexer, controlled by the ATPG enable signal connects the TCKB signal to an extra clock pin.

Referring now to FIG. 8 this shows an example of a device identification register one bit cell incorporating the present invention; similar parts to those shown in preceding Figures are indicated by the same reference numeral. No further description is thought necessary.

Figure 9:
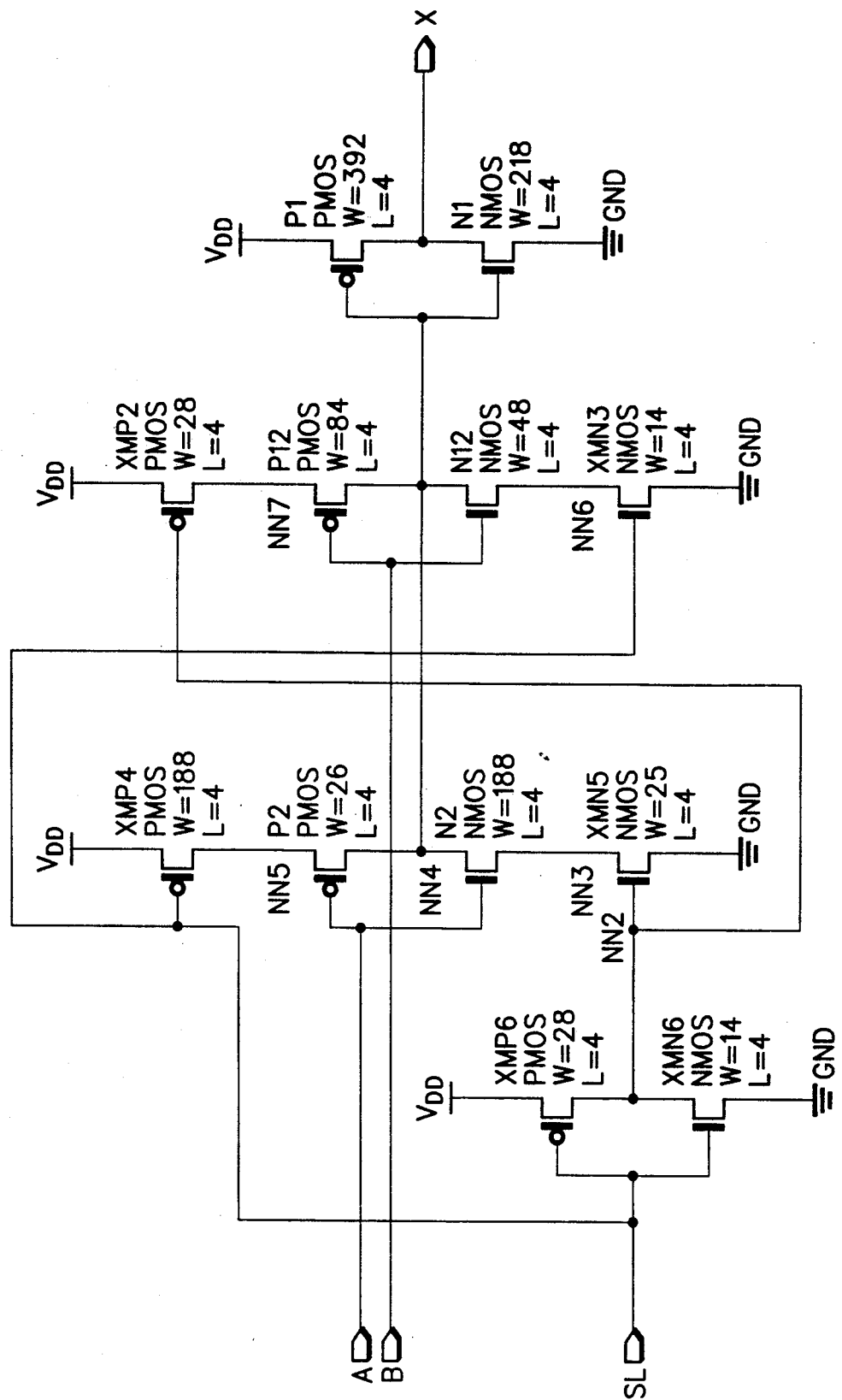
FIG. 9 is a circuit diagram of the multiplexer of FIGS. 5 and 6.

Referring now to FIG. 9 this shows a transistor level diagram of the multiplexer 50 of FIG. 5 with two separate inputs A, B being connected to drive separate transistor pairs nn5, nn4 and nn7, nn6. A select input SL is operative to select either of the inputs A, B by switching in nn4, nn5 and nn6, nn7.

There has thus been shown and described a fully synchronous arrangement for implementing the boundary-scan architecture. Whilst all the storage cells of the architecture may be implemented in the manner show with reference to FIGS. 5 to 7, it may be preferred in an ASIC environment merely to implement the boundary-scan cells in the manner shown in FIG. 6 in that the capture and the update sections are separately implemented as standard hard cells in the ASIC library. In an alternative arrangement the multiplexer as shown in FIG. 9 is implemented as a separate hard cell.

We claim:

1. A circuit for the JTAG architecture, the circuit including a first flip-flop having a clock input for receiving a common clock signal, a first multiplexer having a first input for receiving an input data signal, a second input coupled to an output of the first flip-flop, an output coupled to an input of the first flip-flop, and a select input for receiving a control signal for selectively coupling the first or second inputs to the multiplexer output, a second flip-flop having a clock input for receiving a common clock signal and a second multiplexer having a first input coupled to an output of the first flip-flop, a second input coupled to an output of the second flip-flop, an output coupled to an input of the second flip-flop, and a select input for receiving a control signal for selectively coupling the first or second inputs to the multiplexer output.

2. A circuit for the JTAG architecture, comprising:
   a scan flip-flop having a clock input for receiving a common clock signal, a first data input, a second data input and a select input, the select input acting to selectively activate either the first data input or the second data input; and
   a multiplexer having a first input for receiving an input data signal, a second input coupled to an output of the scan flip-flop, an output coupled to the first data input of the flip-flop, and a select input for receiving a control signal for selectively coupling the first or second inputs to the multiplexer output.

3. A circuit as claimed in claim 1 wherein each flip-flop comprises a D type flip-flop.

4. A circuit as claimed in claim 2 wherein the control signal comprises said common clock signal gated within a tap controller.

5. A circuit as claimed in claim 2 wherein the multiplexer comprises a first chain of transistors (NN3-NN5) with their main current paths in series, a second chain of transistors (NN6,NN7) with their main current paths in series, and an output section, the gates of the first and second chains of transistors and the output section being selectively coupled to receive the select input and the first and second inputs so as to provide a multiplexing function.

6. A circuit as claimed in claim 2 wherein the multiplexer is implemented as a standard hard cell in an ASIC library of cells.

7. A circuit for a boundary-scan cell for the JTAG Architecture, the circuit including a capture section (50) coupled in cascade to an update section (52), and each section comprising a flip-flop (34,36) having a clock input for receiving a common clock signal (TCK, TCKB) and a multiplexer having a first input for receiving an input data signal, a second input coupled to an output of the flip-flop, an output coupled to a first input of the flip-flop, and a select input for receiving a control signal for selectively coupling the first or second input to the multiplexer output.

8. A circuit as claimed in claim 7 wherein each flip-flop comprises a D type flip-flop.

9. A circuit as claimed in claim 7 wherein each flip-flop comprises a scan flip-flop having a first data input and a second data input and a select input acting to alternatively activate either the first data input or the second data input.

10. A circuit as claimed in claim 7 wherein the multiplexer comprises a first chain of transistors (NN3-NN5) with their main current paths in series, a second chain of transistors (NN6,NN7) with their main current paths in series, and an output section, the gates of the first and second chains of transistors and the output section being selectively coupled to receive the select input and the first and second inputs so as to provide a multiplexing function.

11. A circuit as claimed in claim 7 wherein the multiplexer is implemented as a standard hard cell in an ASIC library of cells.

* * * * *